(12) United States Patent
Emoto

(10) Patent No.: US 7,282,820 B2
(45) Date of Patent: Oct. 16, 2007

(54) STAGE DEVICE AND EXPOSURE APPARATUS

(75) Inventor: Keiji Emoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 133 days.

(21) Appl. No.: 11/074,642

(22) Filed: Mar. 9, 2005

(65) Prior Publication Data
US 2005/0212361 A1 Sep. 29, 2005

(30) Foreign Application Priority Data
Mar. 24, 2004 (JP) ............................. 2004-087078

(51) Int. Cl.
H02K 41/00 (2006.01)
G03F 7/20 (2006.01)

(52) U.S. Cl. ...................... 310/12; 335/53; 335/55; 335/72; 74/409.01; 74/471 XY

(58) Field of Classification Search ............ 310/12–14; 355/53, 55, 72, 77, 30, 67; 356/400–401, 356/500, 509; 74/417 XY, 479.01–479.09
See application file for complete search history.

(56) References Cited

U.S. PATENT DOCUMENTS

| 5,839,324 | A | * | 11/1998 | Hara | ............... | 74/490.09 |
| 6,158,298 | A | * | 12/2000 | Hara | ............... | 74/490.09 |
| 6,177,978 | B1 | * | 1/2001 | Korenaga | ............... | 355/53 |
| 6,226,073 | B1 | | 5/2001 | Emoto | | |
| 6,262,797 | B1 | * | 7/2001 | Horikawa | ............... | 355/53 |
| 6,407,799 | B2 | * | 6/2002 | Hara | ............... | 355/53 |
| 6,552,773 | B2 | | 4/2003 | Emoto | | |
| 6,570,273 | B2 | * | 5/2003 | Hazelton | ............... | 310/12 |
| 6,762,516 | B2 | * | 7/2004 | Maruyama | ............... | 310/12 |
| 6,791,670 | B2 | | 9/2004 | Miyajima et al. | | |
| 6,810,298 | B2 | * | 10/2004 | Emoto | ............... | 700/121 |
| 6,879,382 | B2 | | 4/2005 | Akutsu et al. | | |
| 6,915,179 | B2 | | 7/2005 | Emoto | | |
| 7,038,759 | B2 | * | 5/2006 | Emoto et al. | ............... | 355/30 |

(Continued)

FOREIGN PATENT DOCUMENTS

JP 11-307430 11/1999

(Continued)

OTHER PUBLICATIONS

Korean Office Action dated Jul. 31, 2006, issued in corresponding Korean patent application No. 10-2005-0024323.

Primary Examiner—Tran Nguyen
(74) Attorney, Agent, or Firm—Fitzpatrick, Cella, Harper & Scinto

(57) ABSTRACT

An exposure apparatus which aligns a substrate by a stage device for driving a movable element, mounted with a substrate thereon, by using a plane motor. The stage device includes (i) a stator unit having a coil group, and (ii) the movable element, which moves on the stator unit. The stator unit includes (a) an exposure region where the substrate is to be subjected to a process of exposing the substrate, and (b) a measurement region where the substrate is to be subjected to a process of measuring a position of the substrate. The coil group in the stator unit is temperature-controlled independently between the exposure region and the measurement region.

7 Claims, 8 Drawing Sheets

U.S. PATENT DOCUMENTS

| | | | |
|---|---|---|---|
| 7,064,804 B2 * | 6/2006 | Emoto | 355/30 |
| 2002/0140298 A1 * | 10/2002 | Maruyama | 310/54 |
| 2003/0007136 A1 | 1/2003 | Emoto et al. | |
| 2003/0035088 A1 | 2/2003 | Emoto | |
| 2004/0072434 A1 * | 4/2004 | Maruyama | 438/690 |
| 2004/0080727 A1 | 4/2004 | Emoto | |
| 2004/0130688 A1 | 7/2004 | Emoto | |
| 2004/0246455 A1 | 12/2004 | Emoto | |
| 2005/0016685 A1 | 1/2005 | Emoto et al. | |
| 2005/0092013 A1 | 5/2005 | Emoto | |
| 2005/0099629 A1 | 5/2005 | Akutsu et al. | |
| 2005/0132962 A1 | 6/2005 | Emoto | |
| 2005/0152088 A1 | 7/2005 | Ito et al. | |

FOREIGN PATENT DOCUMENTS

| | | |
|---|---|---|
| JP | 2001-175434 | 6/2001 |
| JP | 2001-217183 | 8/2001 |
| KR | 1999-0083450 | 11/1999 |

* cited by examiner

STAGE DEVICE AND EXPOSURE APPARATUS

FIELD OF THE INVENTION

The present invention relates to a stage device and, more particularly, is suitably used by a stage device in an exposure apparatus in which an alignment system and an exposure apparatus are formed independently of each other.

BACKGROUND OF THE INVENTION

In an exposure apparatus, a structure in which an alignment system and an exposure system are formed independently of each other and a plane motor is employed as a positioning stage is disclosed in Japanese Patent Laid-Open No. 2001-217183. FIG. 8 is a view showing a stage device in the exposure apparatus disclosed in Japanese Patent Laid-Open No. 2001-217183.

Referring to FIG. 8, reference symbol PL denotes a projection optical system; and ALG, an alignment optical system. A stator 112 as a base has a measurement (alignment) region and an exposure region. Two movable stages (WST1 and WST2) can move in the measurement region and exposure region independently of each other. In this exposure system, exposure and alignment measurement can be performed simultaneously so that the throughput can be improved.

The plane motor has a magnet group (not shown) arrayed on the lower surfaces of the movable stages (WST1 and WST2) and a coil group 98 arrayed in a matrix in the stator 112. The Lorentz force generated by the mutual operation of the magnetic fluxes of the magnet group and a current flowing through the coil group can move the movable stages (WST1 and WST2) relative to the stator 112.

FIG. 7 shows the coil cooling structure of a plane motor disclosed in Japanese Patent Laid-Open No. 2001-175434. The coil group of the plane motor stator is sealed by a stator main body 32. In FIG. 7, a refrigerant is supplied from 88A (88B) and discharged from 92A (92B) to cool the coil group in the stator.

Generally, a stage operation for performing alignment measurement and a stage operation for performing exposure are often different from each other. In an exposure process, scanning must be performed for every shot of the exposure target. Thus, the stage moves uniformly to a certain degree through the entire region. In alignment measurement, the movement required of the stage varies depending on the accuracy to be obtained and a measuring method. Therefore, usually, the energization amount for the coil group arranged in the exposure region and that for the coil group arranged in the measurement region are different and, naturally, the heat values of the two coil groups are expected to be different.

For example, in the alignment measurement, assume that a scheme that does not measure the entire wafer, but measures only a certain representative point, is employed. The movement of the stage required in the alignment measurement may be smaller than that required in the exposure region, and the energization amount and energization time of the coils are accordingly smaller than those for the coils in the exposure region. Therefore, the heat amount of the coil group in the measurement region becomes smaller than that in the exposure region. In short, heat generation of the coil group in the stator largely differs between the two regions.

For this reason, in an exposure apparatus having two independent regions, i.e., an exposure and a measurement region, as in the device in FIG. 8, if the coil group in the stator is cooled collectively, as in the device in FIG. 7, the cooling efficiency is expectedly poor. Usually, the flow rate of the refrigerant flowing through a refrigerant pipe 89A (89B) of FIG. 7 is set such that the temperature of the refrigerant becomes equal to or less than allowable temperature with respect to a coil with the largest heat generation.

In the structure in which the coil group in the stator is cooled collectively, if variations in coil heat generation are large, a coil with small heat generation is cooled by an excessively large amount of refrigerant. As a result, although a large amount of refrigerant is supplied as a whole, the maximum coil temperature cannot be suppressed easily.

SUMMARY OF THE INVENTION

It is an object of the present invention to efficiently remove, in a stage device having different process regions, heat generated by driving of a movable element having an object thereon.

In order to achieve the above object, according to the present invention, there is provided a stage device for driving a movable element, mounted with an object thereon, by using a plane motor, comprising a stator unit having a coil group, and the movable element which moves on the stator unit, the stator unit comprising a first region where the object is to be subjected to a first process, and a second region where the object is to be subjected to a second process, wherein the coil group in the stator unit is temperature-controlled independently between the first and second regions.

According to the present invention, in a stage device having different process regions, heat generated by driving of a movable object mounted with an object thereon can be removed efficiently.

DETAILED DESCRIPTION OF THE PREFERRED EMBODIMENT

First Embodiment

Figure 1A:
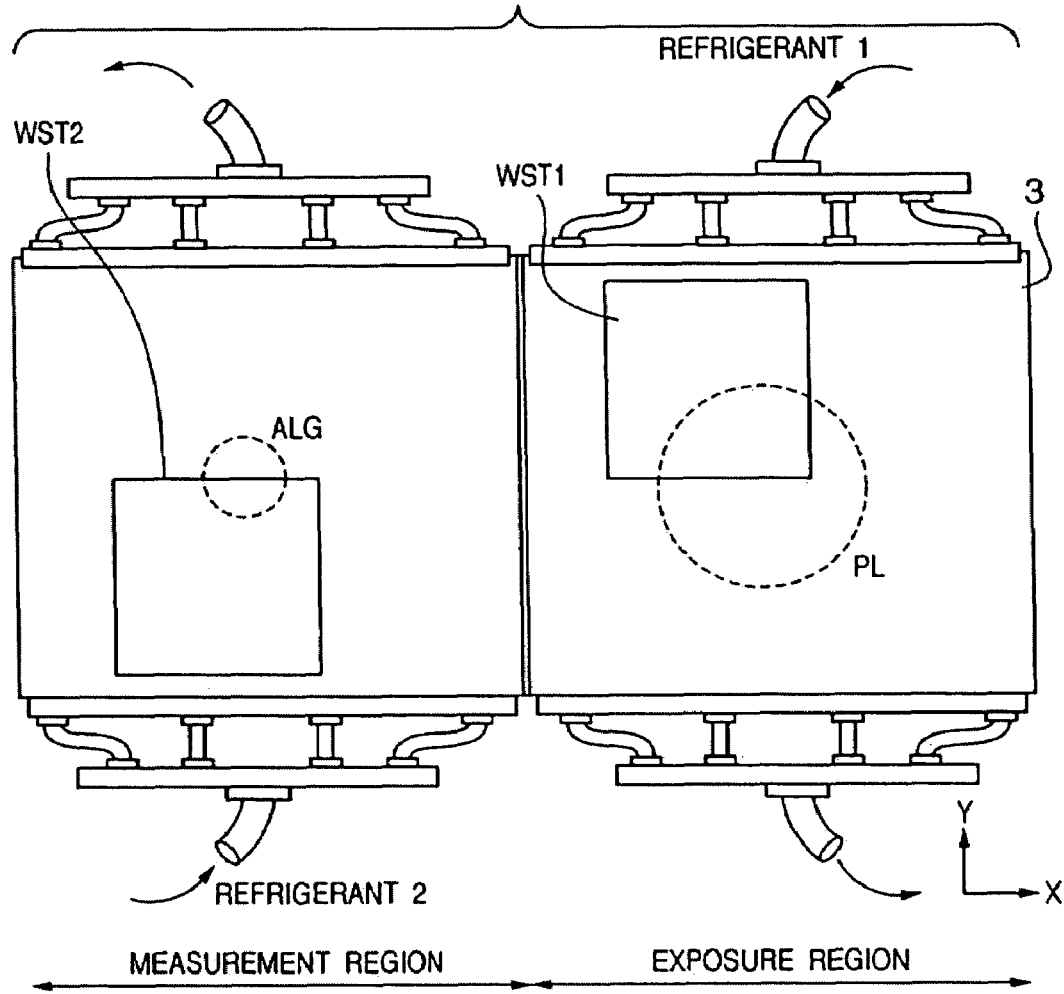
FIGS. 1A and 1B are views showing a stage device according to the first embodiment.
Figure 1B:
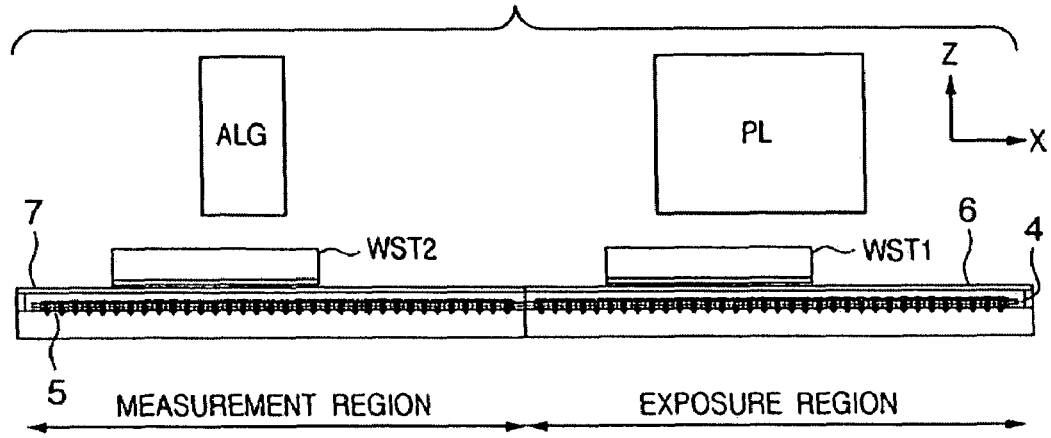

FIGS. 1A and 1B show a stage device according to the first embodiment. FIG. 1A is a view of the stage device seen from above, and FIG. 1B is a sectional view of the stage device seen from the horizontal direction. The stage device is divided into an exposure region and a measurement region. An exposure optical system PL is arranged in the exposure region, and a measurement optical system ALG for alignment measurement is arranged in the measurement region.

On stator units 3, two movable stages (WST1 and WST2) can perform an exposure operation and a measurement operation in the corresponding regions. The movable stages WST1 and WST2 can be swapped between the exposure region and the measurement region. For example, the movable stage WST2, where a wafer measurement operation has been finished, swaps regions with the movable stage WST1, where exposure has been finished. The movable stage WST2 continuously starts an exposure operation. The movable stage WST1 transfers an exposed wafer to a wafer transport system (not shown) and receives a new wafer transport system (not shown) and receives a new wafer to start an alignment operation. When the system is formed to perform an exposure operation and a measurement operation, such as alignment, simultaneously in this manner, the wafer process time as a whole can be shortened, and the throughput can be improved.

Magnet groups (not shown) are arranged on the lower surfaces of the plate-like top plates of the movable stages WST1 and WST2, respectively. The stator units 3 facing the movable stages include coil groups 4 and 5, each formed of a large number of layers of coil arrays, and cooling jackets 6 and 7, which seal the coil groups 4 and 5. Thus, the Lorentz force generated by the interaction of the magnet groups of the movable stages and a current supplied to the coil groups moves the movable stages WST1 and WST2 with respect to the stator units 3.

A refrigerant, such as temperature-controlled pure water or an inert refrigerant, flows through the cooling jackets 6 and 7 to be able to cool the coils directly. Alternatively, the coils may be cooled by providing cooling pipes among the coils.

Figure 2:
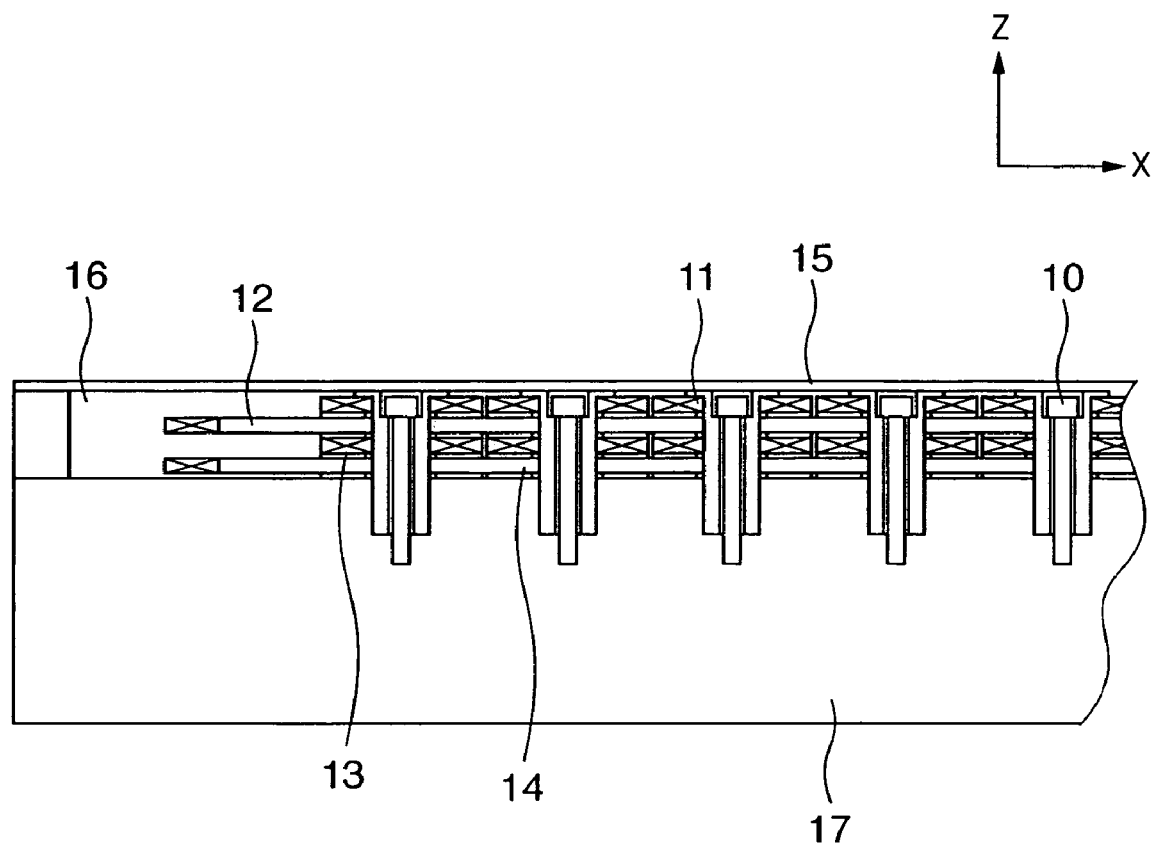
FIG. 2 is a view showing a stator unit in detail.
Figure 3A:
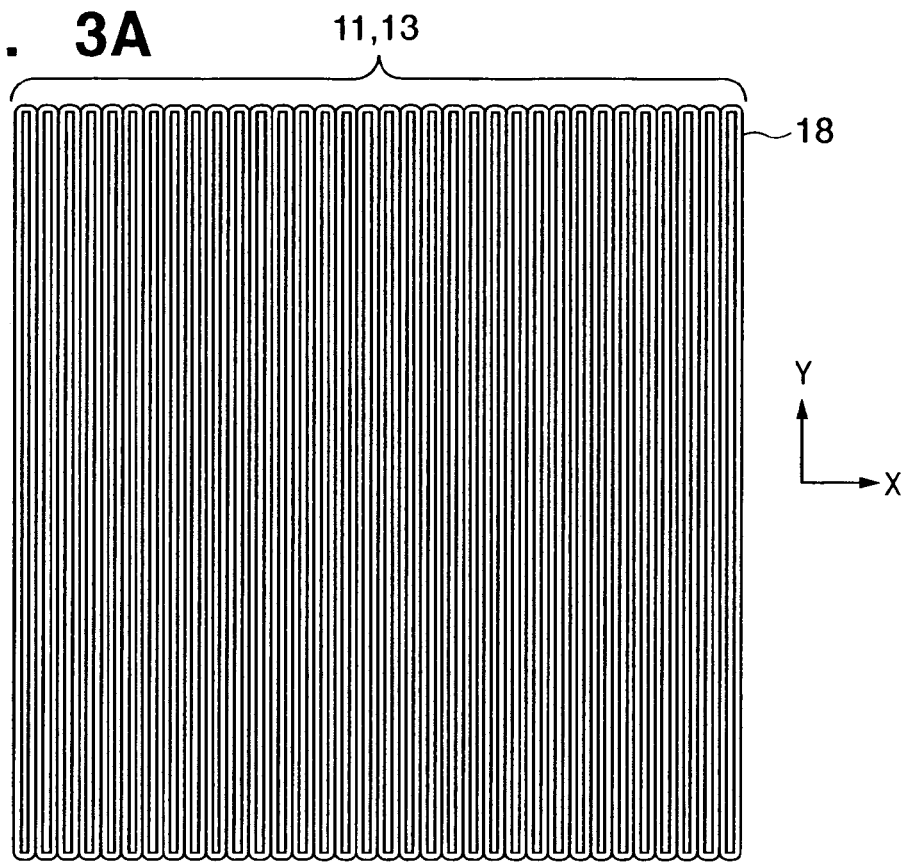
FIG. 3A shows a coil array in an odd-numbered layer.

FIG. 2 is an enlarged view of part of the coil group 4 or 5 in the corresponding stator unit 3. As described above, the coil group has a large number of layers of coil arrays in the vertical direction. In FIG. 2, a coil array 11 at the first layer from the top is a coil array that contributes to driving in an X-axis direction and an ωz direction (rotational direction about the Z-axis). The coil array 11 is formed by arranging a plurality of coils 18, having straight portions elongated in the Y-axis direction, as shown in FIG. 3A, in the X-axis direction.

Figure 3B:
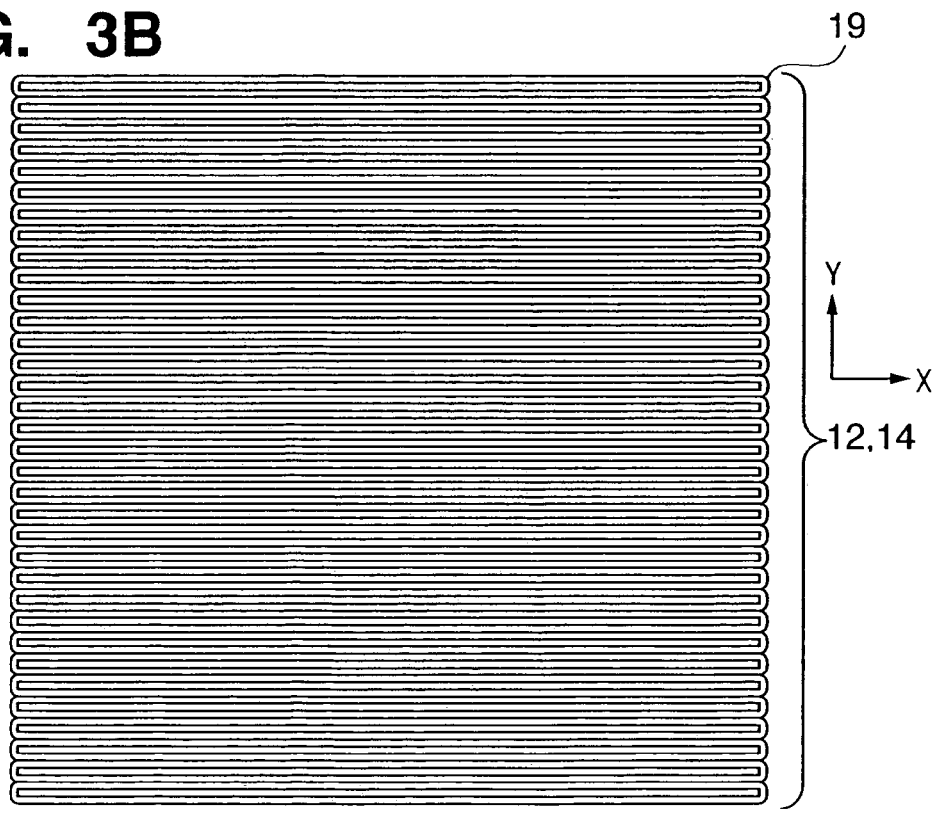
FIG. 3B shows a coil array in an even-numbered layer.
Figure 4:
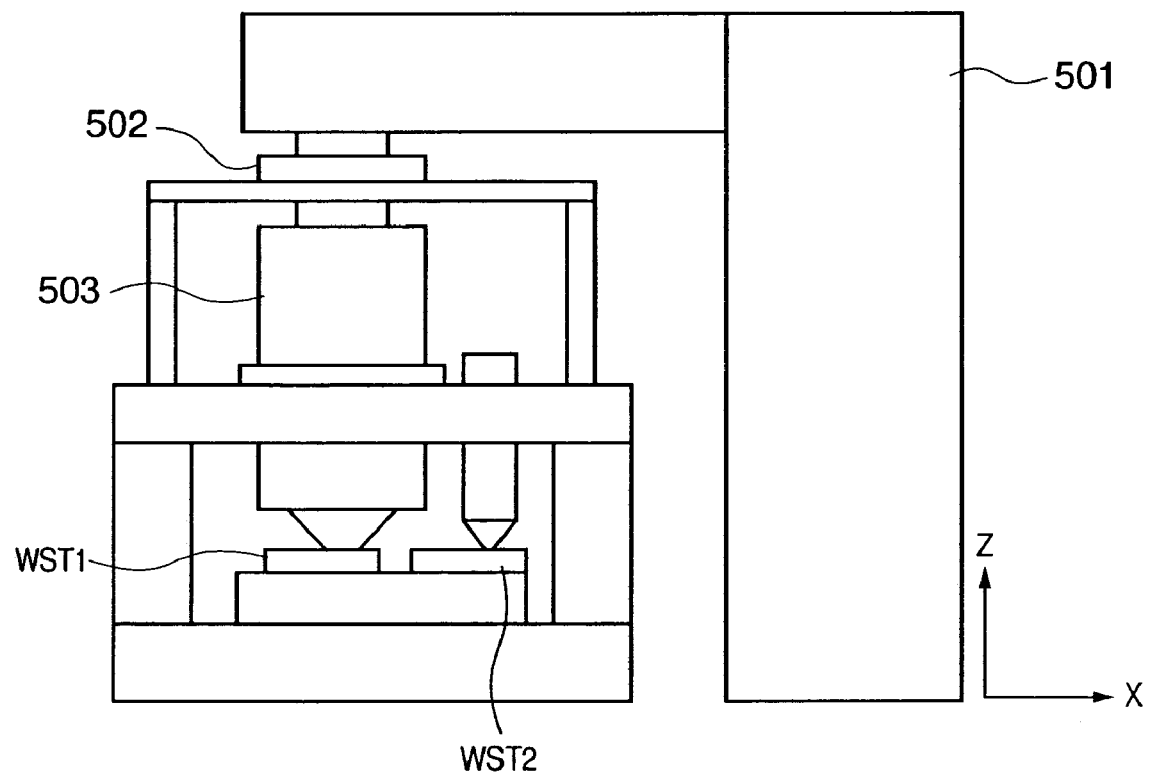
FIG. 4 is a view showing an exposure apparatus.

Similarly, a coil array 12 at the second layer from the top is a coil array that contributes to driving in a Y-axis direction and the ωz direction. The coil array 12 is formed by arranging a plurality of coils 19, having straight portions elongated in the X-axis direction, as shown in FIG. 3B, in the Y-axis direction. A coil array 13 at the third layer is a coil array that contributes to driving in a Z-axis direction and the ωy direction (rotational direction about the Y-axis). The coil array 13 is formed as shown in FIG. 3A. A coil array 14 at the fourth layer is a coil array that contributes to driving in the Z-axis direction and an ωx direction (rotational direction about the X-axis). The coil array 14 is formed as shown in FIG. 4. The four layers of coil arrays can drive the movable stages in six-axis directions.

Figure 8:
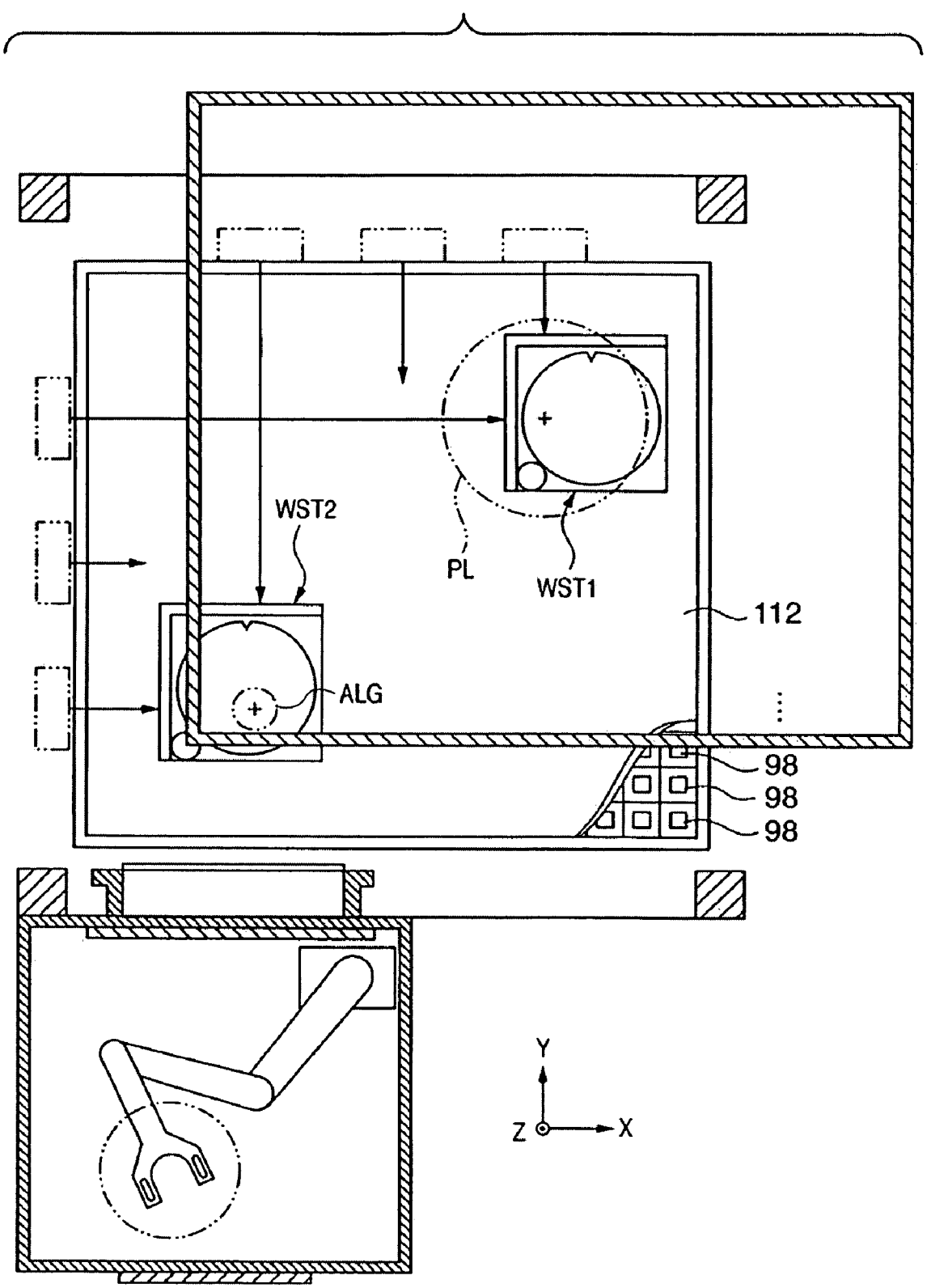
FIG. 8 is a view showing the structure of twin stages according to the prior art.

The arrangement of the coil group is not limited to this. As shown in FIG. 8, coils may be arranged in a matrix. Furthermore, the plane motor suffices as far as its stator unit has a coil group serving as a heat generating portion.

The respective coil arrays are supported on a base surface plate 17 through support members 10. The gaps among the coil arrays form refrigerant flow channels. More specifically, the upper and lower surfaces of the coils come into contact with the circulating refrigerant so that they can be cooled directly. When the coil group is cooled in this manner by circulating the refrigerant in the cooling jacket that surrounds the coil group, heat generated by the coils is removed quickly to prevent excessive temperature rise of the coils and temperature rise of the stator unit.

The cooling jackets 6 and 7 are provided to the exposure region and measurement region independently of each other, and can optimally cool the corresponding regions independently of each other. If all the stators of a plane motor are cooled collectively as in the prior art, the entire cooling efficiency is poor, and the refrigerant temperature controlling unit, refrigerant circulating unit, and the like, may become bulky. When the measurement region and exposure region where the stages move differently can be cooled independently of each other, the respective regions can be cooled (e.g., the flow rate of the refrigerant, temperature, and the type of refrigerant) optimally for the movement of the stages. Then, an increase in the cooling efficiency can be expected, and units related to temperature control can be made compact.

This will be described in more detail. When cooling aims at prevention of overheating of the coils, the cooling amount (the flow rate of the refrigerant, the temperature of the refrigerant, and the type of the refrigerant) is adjusted for a coil with the largest heat generation. When the two regions, i.e., the measurement region and exposure region, are to be cooled collectively, the cooling amount is set to a value for the coil with the largest heat generation among all the coils.

Usually, however, the stages move in the measurement and exposure region largely differently from each other, and, accordingly, the heat generation amount of the coils is largely different between the measurement region and exposure region. For example, assume that the stage in the exposure region moves actively while the stage in the measurement stage does not move very actively so much as a stage because of wafer transfer, or the like. Then, only the coil groups in the exposure region generates heat largely, and the coil group in the measurement region rarely generates heat.

If the two regions are to be cooled collectively, the refrigerant in a cooling amount for the coils in the exposure region is supplied to the entire cooling jacket, so that an excessively large amount of refrigerant flows to the coil group in the measurement region wastefully. For example, an excessively large flow rate of the refrigerant is required for all the stators. The cooling efficiency (that is, the removing rate of heat generated by the coils to the flow rate of the refrigerant) decreases, and the units concerning temperature control become bulky.

In view of these situations, in FIGS. 1A and 1B, the measurement region and exposure region can be cooled independently of each other. More specifically, as the stages in the measurement region and exposure region move largely differently, cooling of the respective regions is optimized independently to increase the cooling efficiency as a whole. Cooling optimization includes, e.g., a change in at least one of the flow rate of the refrigerant, the temperature, and the type of the refrigerant between the measurement region and exposure region.

As shown in FIGS. 1A and 1B, the flowing direction of the refrigerant can also be changed. For example, when the flowing direction of the refrigerant is changed between the exposure region and measurement region, the refrigerant can be supplied into each region from the vicinity of a coil with the largest heat generation, so that optimal cooling can be performed.

The above example mainly aims at optimizing cooling in the measurement region and exposure region independently. Naturally, as a result of optimization of the cooling in each region, sometimes, the flow direction of the refrigerant becomes the same between the two regions, and the flow rate of the refrigerant may become the same between the two regions. Therefore, the cooling method (that is, the flow rate of the refrigerant, the temperature, the type of the refrigerant, and the like) need not be changed between the measurement region and the exposure region.

In FIGS. 1A and 1B, the stator units 3 appear to be provided to the measurement region and the exposure region independently. The stator units themselves may be independent for the respective regions or be integral throughout the respective regions. It suffices as far as the interiors of the cooling jackets 7 and 7 can be temperature-controlled independently of each other.

The background for providing the stator units 3 to the exposure region and measurement region independently of each other, as in the devices in FIGS. 1A and 1B, will be described.

In a plane motor in an exposure apparatus having an independent alignment system and exposure system, problems arise also in terms of the fabrication and maintenance of the stators. More specifically, the minimum size of the stator unit of the plane motor is substantially determined by the wafer size. When a 12-inch (300-mm) wafer is the object to be processed, the necessary stroke of the movable stage in each of the measurement region and exposure region is about 400 mm (distance necessary for movement through the entire wafer region + distance necessary for the acceleration/deceleration region of the stage). In other words, assuming that the size of the movable stage (WST1 and WST2) is about 400 mm, the stator unit is assumed to require a size of 700 mm (300 mm as wafer size +400 mm for stroke) or more at the minimum.

Therefore, the size of a stator unit including the measurement region and exposure region is at a minimum of 700 mm (X direction in FIG. 8)×1,400 mm (Y direction in FIG. 8). In practice, the size of the stator unit tends to become larger due to various factors. If the stator unit having this size is to be fabricated as one integral unit, the necessary material may be difficult to obtain and the degree of freedom of machining may be limited by the limitations of the machine tool highly likely. Accordingly, the cost may be expected to increase. That is, if a measurement region and an exposure region are provided independently of each other, the size of the stator may increase to cause difficulties in the manufacture.

As shown in FIGS. 1A and 1B, when the stator unit includes separate units divided into the exposure region and measurement region, each fabrication size becomes half. As for fabrication of the stator unit, an exposure region unit and fabrication of a measurement region unit can be fabricated simultaneously, so that the fabrication lead time can also be decreased. From the viewpoint of maintenance, a countermeasure need be taken only for a unit where trouble occurs. Thus, the maintenance need only be performed often on a small scale.

The above description has been made by exemplifying a stage device using a plane motor. In a stage device provided with separate linear motors to drive respective stages for the exposure region and measurement region as well, to temperature-control the respective driving means independently of each other is effective in terms of the cooling efficiency. Note that the stage device using a plane motor is effective because the exposure region and measurement region can be cooled independently of each other with a simple structure, and the heat generation amount of the coils is large.

FIG. 4 shows an exposure apparatus for semiconductor device manufacture which uses a stage device similar to that described above as a wafer stage.

This exposure apparatus is used to manufacture devices having fine patterns, e.g., a semiconductor device such as a semiconductor integrated circuit, a micromachine, and a thin-film magnetic head. Exposure light (this is a generic term for visible light, ultraviolet light, EUV light, X-rays, an electron beam, a charged particle beam, or the like) serving as exposure energy from an illumination system unit 501 through a reticle as an original irradiates a semiconductor wafer W as a substrate through a projection lens 503 (this is a generic term for a dioptric lens, a reflecting lens, a cata-dioptric lens system, a charged particle lens, or the like) serving as a projecting system to form a desired pattern on a substrate mounted on a wafer stage 504. As the wavelength of the exposure light becomes short, the exposure apparatus requires exposure in a vacuum atmosphere.

A wafer (object) as a substrate is held on a chuck mounted on the wafer stage 504. The pattern of the reticle as the original mounted on a reticle stage 502 is transferred onto the respective regions on the wafer by the illumination system unit 501 in accordance with step and repeat or step and scan. In this case, the stage device described above is used as the wafer stage 504.

When the stage device described above is applied to an exposure apparatus in the above manner, an exposure apparatus requiring a decreased operation cost can be provided.

Figure 5:
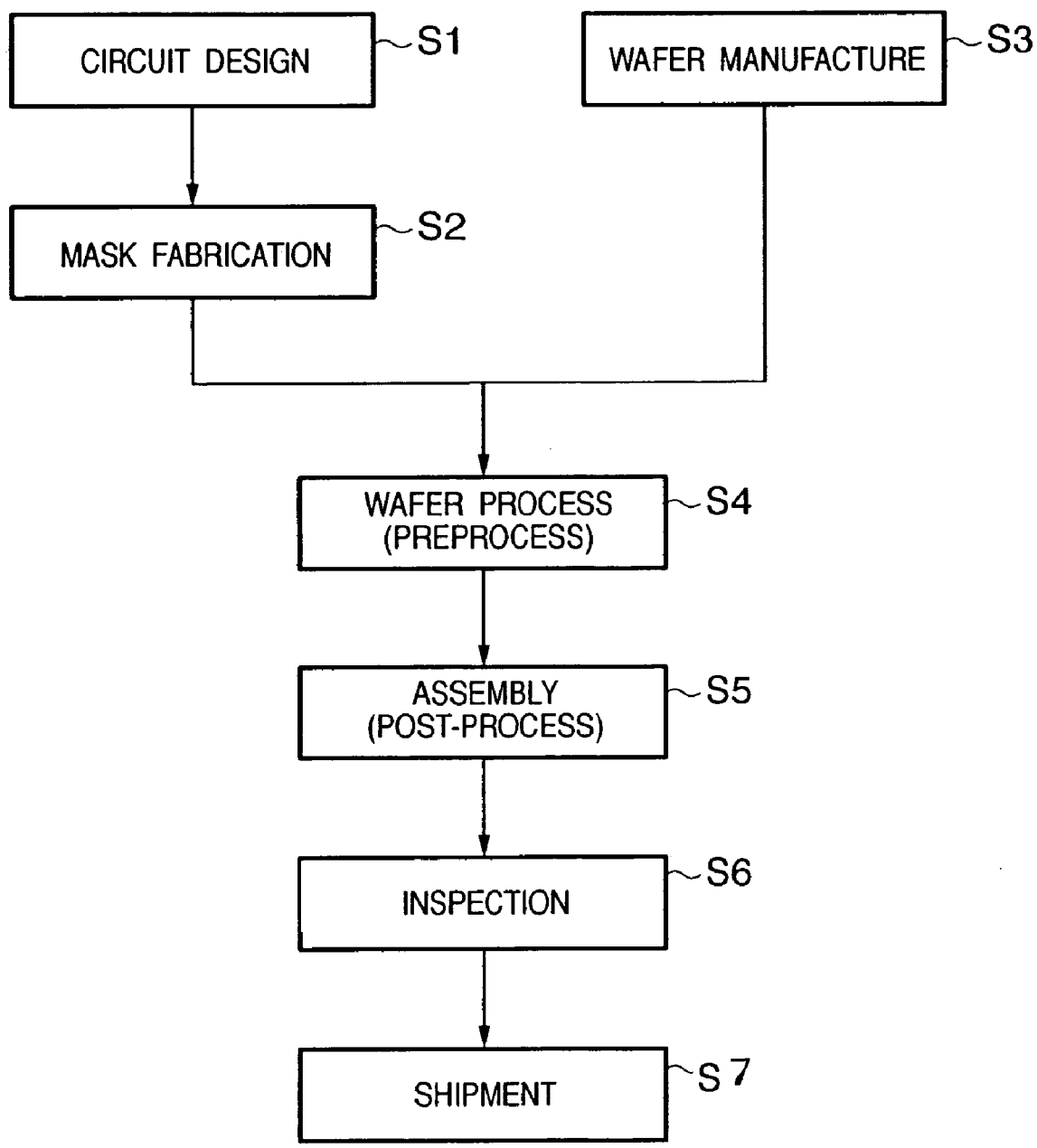
FIG. 5 is a flowchart showing a device manufacturing method.

A semiconductor device manufacturing process which uses this exposure apparatus will be described. FIG. 5 is a flowchart showing the flow of the entire semiconductor device manufacturing process. In step 1 (circuit design), the circuit of a semiconductor device is designed. In step 2 (mask fabrication), a mask is fabricated on the basis of the designed circuit pattern.

In step 3 (wafer manufacture), a wafer is manufactured using a material such as silicon. In step 4 (wafer process), called a preprocess, an actual circuit is formed on the wafer by the above exposure apparatus in accordance with lithography using the above mask and wafer. In the next step, step 5 (assembly), called a post-process, a semiconductor chip is formed from the wafer fabricated in step 4. This step includes assembly processes such as assembly (dicing and bonding) and packaging (chip encapsulation). In step 6 (inspection), inspections including an operation check test and a durability test of the semiconductor device fabricated in step 5 are performed. A semiconductor device is finished with these processes and shipped, in step 7.

Figure 6:
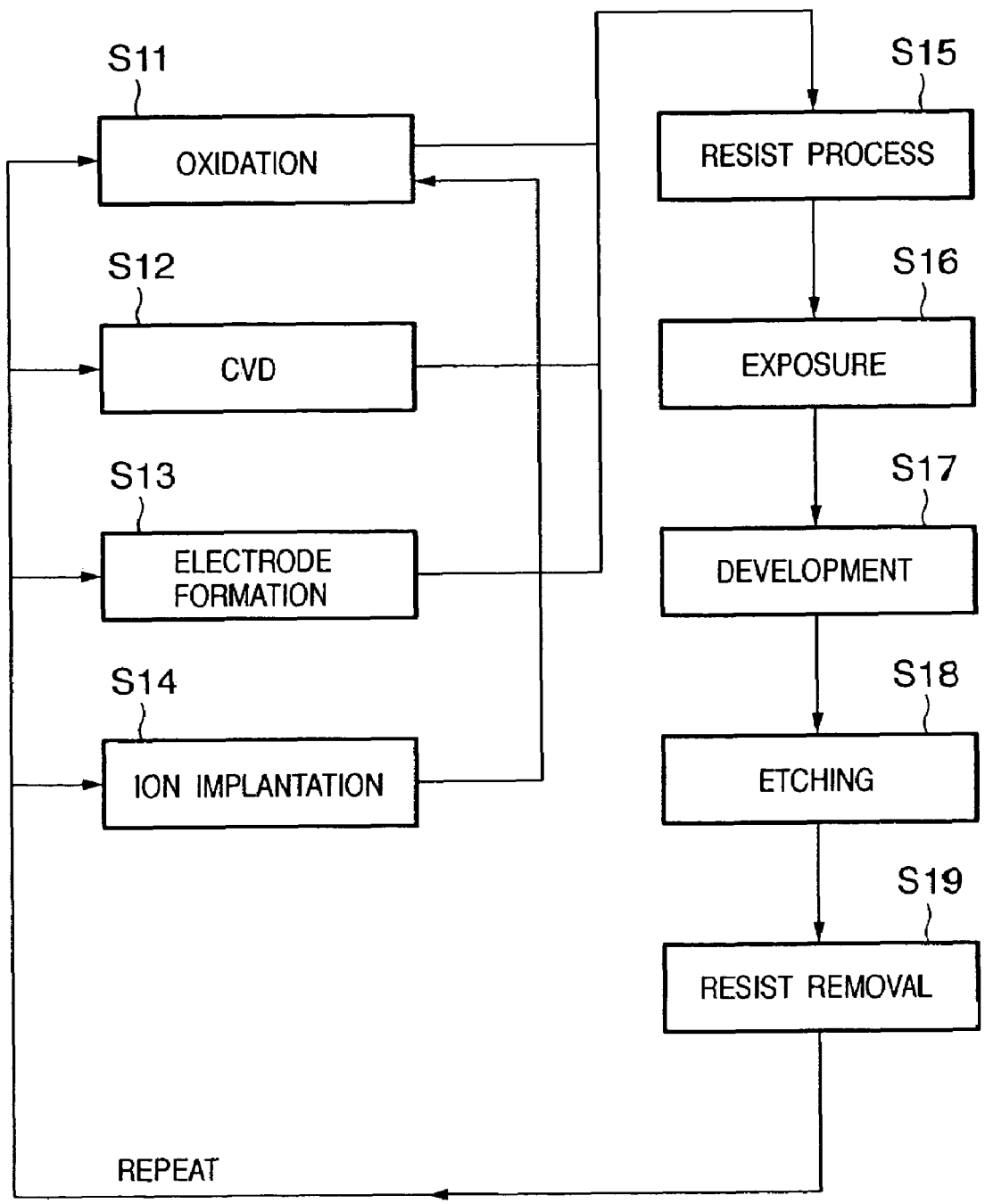
FIG. 6 is a flowchart showing a wafer process in FIG. 5.
Figure 7:
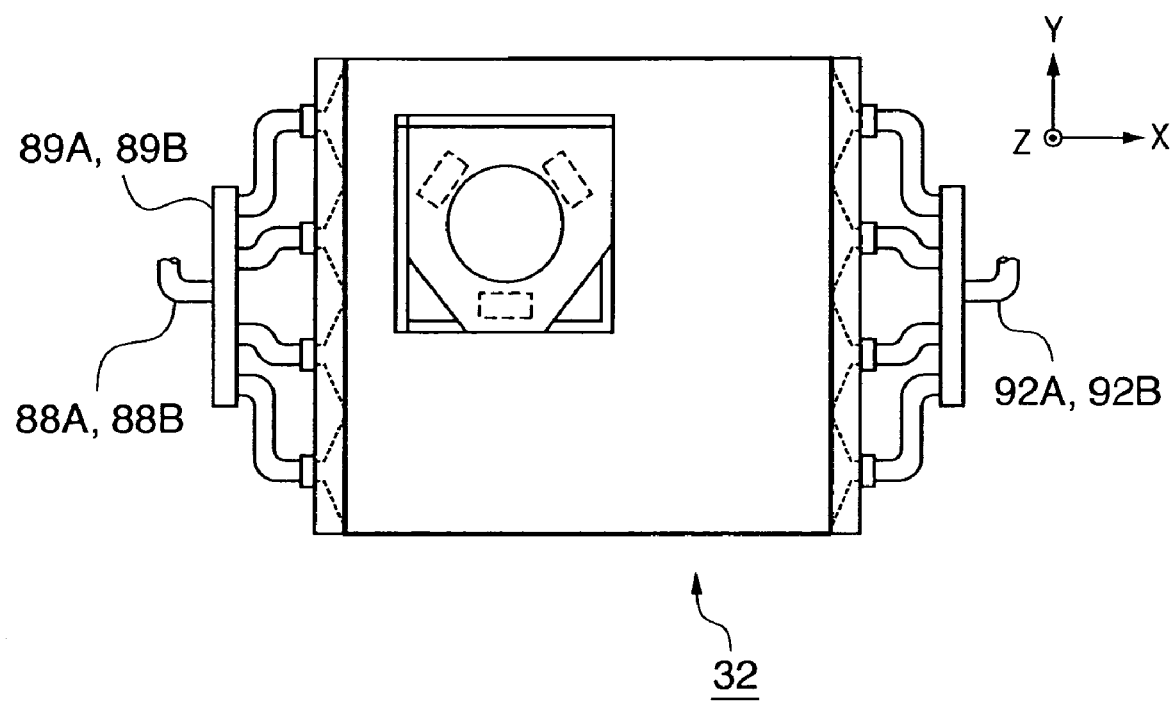
FIG. 7 is a view showing the cooling structure of a plane motor according to the prior art.

The wafer process of the above step 4 includes the following steps (FIG. 6), i.e., an oxidation step of oxidizing the surface of the wafer, a CVD step of forming an insulating film on the wafer surface, an electrode formation step of forming an electrode on the wafer by deposition, an ion implantation step of implanting ions on the wafer, a resist process step of applying a photosensitive agent to the wafer, an exposure step of transferring the circuit pattern to the wafer after the resist process step by the exposure apparatus described above, a developing step of developing the wafer exposed in the exposure step, an etching step of removing portions other than the resist image developed in the developing step, and a resist removal step of removing any unnecessary resist after etching. These steps are repeated to form multiple circuit patterns on the wafer.

When the exposure apparatus described above is used in part of the device manufacturing process in this manner, an inexpensive device can be manufactured.

While the present invention has been described with respect to what is at present considered to be the preferred embodiments, it is to be understood that the invention is not limited to the disclosed embodiments. The present invention is intended to cover various modifications and equivalent arrangements included within the spirit and scope of the appended claims.

CLAIM TO PRIORITY

This application claims priority from Japanese Patent Application No. 2004-087078 filed on Mar. 24, 2004, which is hereby incorporated by reference herein.

What is claimed is:

1. An exposure apparatus which aligns a substrate by a stage device for driving a movable element, mounted with a substrate thereon, by using a plane motor, said stage device comprising:
   (i) a stator unit having a coil group; and
   (ii) a plurality of said movable elements which move on said stator unit,
   said stator unit comprising:
     (a) an exposure region where the substrate is to be subjected to a process of exposing the substrate; and
     (b) a measurement region where the substrate is to be subjected to a process of measuring a position of the substrate,
   wherein one of said movable elements is operated for the exposure process while another of said movable elements is operated for the measurement process, and the coil group of the exposure region and the coil group of the measurement region are temperature-controlled independently, based on a cooling amount corresponding to the operation of the movable element in each region.

2. The apparatus according to claim 1, wherein
   (i) said stator unit has a cooling jacket which surrounds said coil group,
   (ii) said coil group is cooled by supplying a refrigerant into said cooling jacket, and
   (iii) the refrigerant flows in a direction perpendicular to a direction in which the exposure region and the measurement region are arranged.

3. The apparatus according to claim 2, wherein the refrigerant flows in different directions between the exposure region and the measurement region.

4. The apparatus according to claim 1, wherein
   (i) said stator unit has a cooling jacket surrounding the coil group,
   (ii) the coil group is cooled by causing a refrigerant to flow into the cooling jacket, and
   (iii) the refrigerant of the exposure region and the refrigerant of the measurement region differ by at least one of a flow rate, temperature, and medium of the refrigerant.

5. The apparatus according to claim 1, wherein said stator unit is divided in the exposure region and the measurement region.

6. The apparatus according to claim 1, wherein said movable element has a magnet group on a surface thereof which opposes said stator unit, said magnet group serving to generate a force with respect to said coil group of said stator unit.

7. An exposure apparatus which aligns a substrate by a stage device for driving a movable element, mounted with a substrate thereon, by using a plane motor, said stage device comprising:
   (i) a stator unit having a coil group; and
   (ii) a plurality of said movable elements which move on said stator unit,
   said stator unit comprising:
     (a) an exposure region where the substrate is to be subjected to a process of exposing the substrate; and
     (b) a measurement region where the substrate is to be subjected to a process of measuring a position of the substrate,
   wherein each of the coil groups of said stator units of the exposure region and the measurement region is temperature-controlled independently by a refrigerant, and the refrigerant flows in a direction perpendicular to a direction in which the exposure region and the measurement region are arrayed.

* * * * *